United States Patent [19]
Sun et al.

[11] Patent Number: 5,792,569
[45] Date of Patent: Aug. 11, 1998

[54] MAGNETIC DEVICES AND SENSORS BASED ON PEROVSKITE MANGANESE OXIDE MATERIALS

[75] Inventors: Jonathan Zanhong Sun, Mohegan Lake; Arunava Gupta, Valley Cottage, both of N.Y.; Gang Xiao, Barrington, R.I.; Philip Louis Trouilloud, Yorktown Heights, N.Y.; Philippe P. Lecoeur, Flers, France

[73] Assignee: International Business Machines Corporation, Armonk, N.Y.

[21] Appl. No.: 618,184

[22] Filed: Mar. 19, 1996

[51] Int. Cl.$^6$ .................................. G11B 5/147
[52] U.S. Cl. ................ 428/692; 428/693; 428/701; 428/702; 428/900; 324/252; 338/32 R; 360/113
[58] Field of Search ................ 428/692, 693, 428/701, 702, 900; 324/252; 338/32 R; 360/113

[56] References Cited

U.S. PATENT DOCUMENTS

| | | | |
|---|---|---|---|
| 5,270,298 | 12/1993 | Ramesu | 505/1 |
| 5,390,061 | 2/1995 | Nakatani et al. | 360/113 |
| 5,411,814 | 5/1995 | Jin et al. | 428/692 |
| 5,538,800 | 7/1996 | Jin et al. | 428/692 |
| 5,549,977 | 8/1996 | Jin et al. | 428/692 |
| 5,563,331 | 10/1996 | Von Helmolt et al. | 73/31.05 |

OTHER PUBLICATIONS

Moodera, J.S., et al Large Magnetoresistance at Room Temperture in Ferromagnetic Thin Film Tunnel Junctions, Physical Review Letters, vol. 74., No. 16, 17 Apr. 1995, pp. 3273–3276.

Jin, S., et al "Thousandfold Change in Resistivity in Magnetoresistive La–Ca–Mn–O Films", Science, vol. 264, 15 Apr. 1994, pp. 413–415.

von Helmolt, R., et al "Giant Negative Magnetoresistance in Perovskitelike $La_{2/3}Ba_{1/3}MnO_x$ Ferromagnetic Films", Physical Review Letters, vol. 71, No. 14, 4 Oct. 1993, pp. 2331–2333.

White, R.L., "Giant Magnetoresistance Materials and Their Potential as Read Head Sensors", IEEE Transactions on Magnetics, vol. 30, No. 2, Mar. 1994, pp. 346–352.

Heim, D.E., "Design and Operation of Spin Valve Sensors", IEEE Transactions on Magnetics, vol. 30, No. 2, Mar. 1994, pp. 316–321.

Slonczewski, J.C., "Magnetic Bubble Tunnel Detector", IBM Technical Disclosure Bulletin, vol. 19, No. 6, Nov. 1976, pp. 2328–2330.

Slonczewski, J.C., "Magnetic–Barrier Current Amplifier", IBM Technical Disclosure Bulletin, vol. 19, No. 6, Nov. 1976, pp. 2333–2336.

Markham, D. et al, "Magnetoresistive Head Technology", Proceedings of the Symposium on Magnetic Materials, Processes and Devices, Proceedings vol. 90–8, May 1990 pp. 185–204.

Primary Examiner—Stevan A. Resan
Attorney, Agent, or Firm—Stephen S. Strunck

[57] ABSTRACT

A tri-layer thin film magnetoresistive device using doped perovskite manganate thin films as ferromagnetic elements, wherein a current is transported through the tri-layer structure, is disclosed. A large magnetoresistance change of about a factor of two is obtained in a low magnetic field, less than 150 Oe, which is close to the coercivity of the material of the elements. This device demonstrates that low-field spin-dependent transport in the manganates can be accomplished and that the magnitude of the resulting magnetoresistance is suitable for magnetoresistive field sensor applications.

17 Claims, 10 Drawing Sheets

AXES

MAGNETIC DEVICES AND SENSORS BASED ON PEROVSKITE MANGANESE OXIDE MATERIALS

FIELD OF THE INVENTION

This invention relates to magnetoresistive thin film materials and devices which are extensively used in magnetic data storage. More particularly, it relates to the application of doped perovskite manganate thin films in the formation of devices with large, low field magnetoresistive response.

BACKGROUND OF THE INVENTION

Magnetoresistive elements are used extensively in read-heads in modern disk drives. Exploratory work has also begun on using them in magnetic random access memory (MRAM) chips. For high density storage applications, large magnetoresistive modulation is critical. For MRAM technology to be competitive against the existing static random access memory (SRAM) in terms of density and cost, it is necessary, among other considerations, to achieve over 20% resistance modulation in less than 20 Oe of magnetic field. Recently, magnetoresistive sensors have also found potential use in other areas of magnetic field sensing, such as in the automotive industry. Strong desires exist for high sensitivity magnetoresistive elements.

Devices being considered for use as high magnetoresistance sensors include metallic multilayers (e.g., R. L. White, "Giant magnetoresistance materials and their potential as read head sensors", IEEE Trans. Magn. (USA) 30, 346 (1994)), metal-based spin-valves (e.g. D. E. Heim, R. E. Fontana, C. Tsang, V. S. Speriosu, B. A. Gurney, M. L. Williams, "Design and operation of spin valve sensors", IEEE Trans. Magn. (USA), 316 (1994)), and metal-insulator-metal spin-dependent tunneling valves (e.g., J. C. Slonczewski, "Magnetic Bubble Tunnel Detector", IBM Technical Disclosure Bulletin, Vol. 19, No 6, page 2328, (1976), and J. Moodera, Terrilyn M. Wong, Lisa R. Kinder and R. Meservey, "Large magnetoresistance at room temperature in ferromagnetic thin film tunnel junctions", Phys. Rev. Lett. 74, 3273 (1995). The foregoing articles are incorporated herein by reference. The best reported saturation magnetoresistance modulation one obtains with these technologies are of the order of 25% or less in a laboratory environment. Improvement of magnetoresistance in these technologies has been incremental in the past.

A new class of strongly magnetoresistive material was reported during the past two years. (See, e.g., S. Jin, T. H. Tiefel, M. McCormack, R. A. Fastnacht, R. Ramesh, L. H. Chen, "Thousandfold change in resistivity in magnetoresistive La-Ca-Mn-O films", Science 264, 413 (1994), and R. von Helmolt, J. Wecker, B. Holzapfel, L. Schultz, and K. Samwer, "Giant negative magnetoresistance in perovskite $La_{2/3}Ba_{1/3}MnO_x$", Phys. Rev. Lett. 71, 2331 (1993)). The foregoing articles are incorporated herein by reference. Resistance modulations of over two orders of magnitude have been seen in these materials. However, all studies to date show that a large magnetic field, of the order of a few Tesla, is needed to induce these large resistance variations. The low field magnetoresistance of these materials remain minimal. Thus it is unclear whether these materials would be useful as magnetoresistive field sensors for weak signals in read-head and in MRAM applications.

Magnetoresistance refers to the magnetic field dependence of electrical resistance of a material. Typical ferromagnetic metals show a magnetoresistance of a few percent.

Giant magnetoresistance effect refers to a relatively large magnetoresistive effect obtained in metallic ferromagnetic multilayers and/or granular thin films. A representative giant magnetoresistance multilayer has magnetoresistance modulations close to 10% with the application of a magnetic field on the order of $10^{+2}$ Oe.

Colossal magnetoresistive effect refers to a large change of resistance in doped perovskite manganates, well over a factor of two, and as large as several orders of magnitude, upon the application of a magnetic field. The magnetic field required for such large changes of resistance is usually fairly high, in the range of several Tesla, or $10^{+4}$ to $10^{+5}$ Oe.

SUMMARY OF THE INVENTION

Spin-dependent transport is realized for manganate thin films by the fabrication of a tri-layer structure, with both bottom and top elements of the structure being made of magnetic thin films which are separated in between by a barrier material that disrupts the magnetic exchange coupling, thus allowing each layer's magnetic moment rotation be separated from the other.

In the preferred embodiment, both the top and the bottom elements are made of ferromagnetic conductors with strong spin-polarization of their conduction electrons. The effective coercivities of the two layers are made different, either by controlling the shape of the elements, or by making the elements with materials with different anisotropy energy, so that when subjected to applied field in the appropriate direction, a relative rotation of the magnetic moment between the top and bottom elements results. A spin-dependent transport process across the separation layer will have its electrical conductivity dependent upon the relative orientation of the magnetic moment. Thus, a magnetoresistive effect will appear.

The magnitude of the magnetic field required to cause a relative rotation of the magnetization of the top and bottom electrodes is of the order of the coercivity of the electrodes. For manganate thin films, this is usually of the order of 1 to 500 Oe, depending upon the choice of materials and the operating temperature. This relatively low field scale allows the observation of magnetoresistance at fields much lower than before, and makes a magnetoresistive element made of the manganates attractive for sensor applications. The electronic structure of the manganate materials is such that its conduction electrons are likely to be strongly spin-polarized leading to a large magnetoresistance modulation as the angle of the magnetization between the top and bottom electrode changes. This means that such sensor devices would be able to respond to low fields. Practically, this translates into higher recording densities for storage media and lower power requirements for memory applications.

In one embodiment, the device was fabricated using photolithographic techniques known in the art by first sequentially depositing three layers of oxide perovskite materials: first 500 Å of $La_{0.67}Ca_{0.33}MnO_3$ (LCMO), followed by about 50 Å of $SrTiO_3$(STO) as the separation layer, followed by another 300 Å of $La_{0.67}Ca_{0.33}MnO_3$ as the top element.

DETAILED DESCRIPTION OF THE INVENTION

Figure 1:
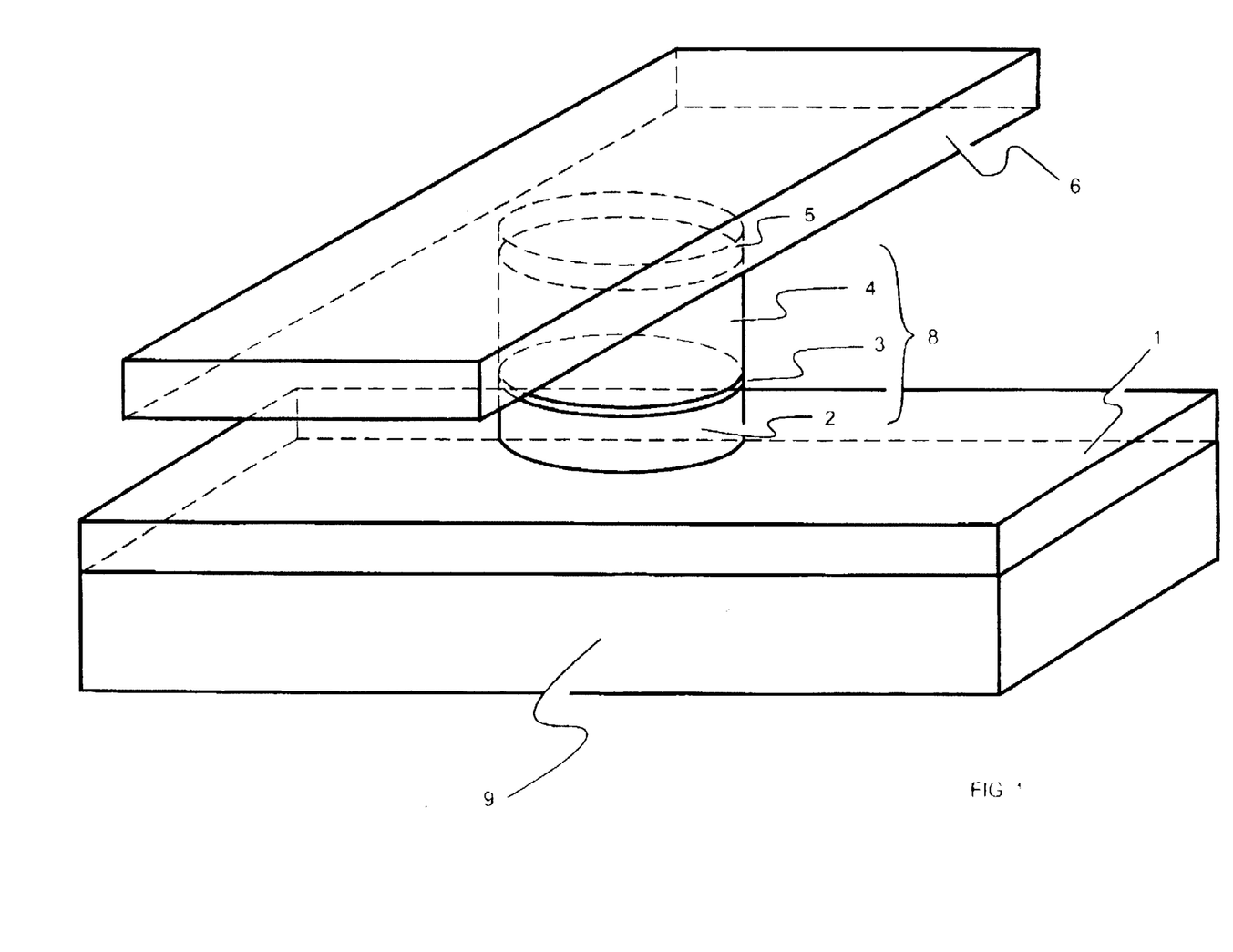
FIG. 1 is a perspective schematic of a magnetoresistive device structure of the invention.

FIG. 1 shows the elements of the structure of this invention. The bottom contact electrode 1 and top contact electrode 6 are connected through a stack of two ferromagnetic thin films, elements 2 and 4, separated in between by a normal metal or insulating layer, element 3. Bottom contact electrode may rest on a substrate (9). Electrode 1 and substrate 9 may be one and the same. Contemplated materials for substrate 9 include, for example, Si and SrTiO$_3$.

The function of layer 3 is to break the exchange coupling between the two ferromagnetic layers 2 and 4. The principal characteristics of layer 3 are that it performs the foregoing function and maintains an electrical path between layers 2 and 4. While the use of metals is conceptually feasible, the presently contemplated materials comprise thin layers of oxides such as SrTiO$_3$.

A protective layer, element 5, lies on top of element 4. In one embodiment, layer 5 was silver which was formed on top of thin film element 4 in situ after the deposition of thin film elements 2, 3, and 4. Protective layer 5 protects the perovskite thin film surface from lithography-related degradation, and at the same time keeps the contact resistance between metal and the perovskite manganates at its minimum. The perovskite manganates tend to form thin oxide interface layers with most commonly used leads that involve metal that can be oxidized, such as copper or aluminum. Such interface causes the increase of contact resistance. So a noble-metal (metals that do not oxidize under normal conditions) protection layer, preferably such as silver, gold or platinum, are used to keep the interface clean and of low resistance. It is important to keep the contact resistance between metal leads and the manganate pillars as low as possible, so that the measured resistance is dominated by the pillar resistance itself, rather than by contact resistances (contact resistances usually don't have large magnetoresistive effects, and will therefore reduce the large magnetoresistance).

Also, it is possible that layer 5 may be eliminated provided a low resistance contact between elements 6 and 4 can be made. In this structure, elements 2 and 4 are the ferromagnetic thin films of doped perovskite manganate. Element 4 may or may not be made using the same material as element 2. Thus, for example, 2 and 4 may both be of a doped manganate perovskite material or one of them may be of a doped manganate perovskite material with the other being of a different ferromagnetic element or compound exhibiting a high degree of spin polarization. Pillar 8 (which comprises elements 2, 3 and 4) is formed using photolithography starting from a trilayer thin film. The top and bottom electrodes (1 and 6) are physically separated by a layer of oxide material such as silicon oxide (not shown in FIG. 1 for clarity).

Doped perovskite manganates refers to the class of material of composition A$_x$B$_y$MnO$_{3-d}$ where A is a trivalent rare-earth element such as La, Pr, Y; B is a divalent alkaline earth element such as Ca or Sr; x and y are chosen in the range where the perovskite structure is stable (maintained as a perovskite structure) and where the material has the desired electronic and magnetic properties and d refers to oxygen vacancy doping, if any.

The particular device shown in FIG. 1 was used to experimentally verify this invention. Thin film trilayers of LCMO/STO/LCMO were made using laser ablation from stoichiometric targets onto SrTiO$_3$ (100) substrates. The substrates were held at 700 C. for the deposition of LCMO, and at 600 C. for STO. The trilayer thin film is in-situ coated with a silver contact/protection layer 5 of approximately 200 Å before being removed from the deposition chamber. This is done to assure good Ohmic contact between lead electrode 6 and top element 4 and at the same time to protect the oxide thin films from any photolithography-related degradation. The making of such structures having the appearance of the device of FIG. 1 may be done using photolithographic techniques known in the art.

Figure 2:
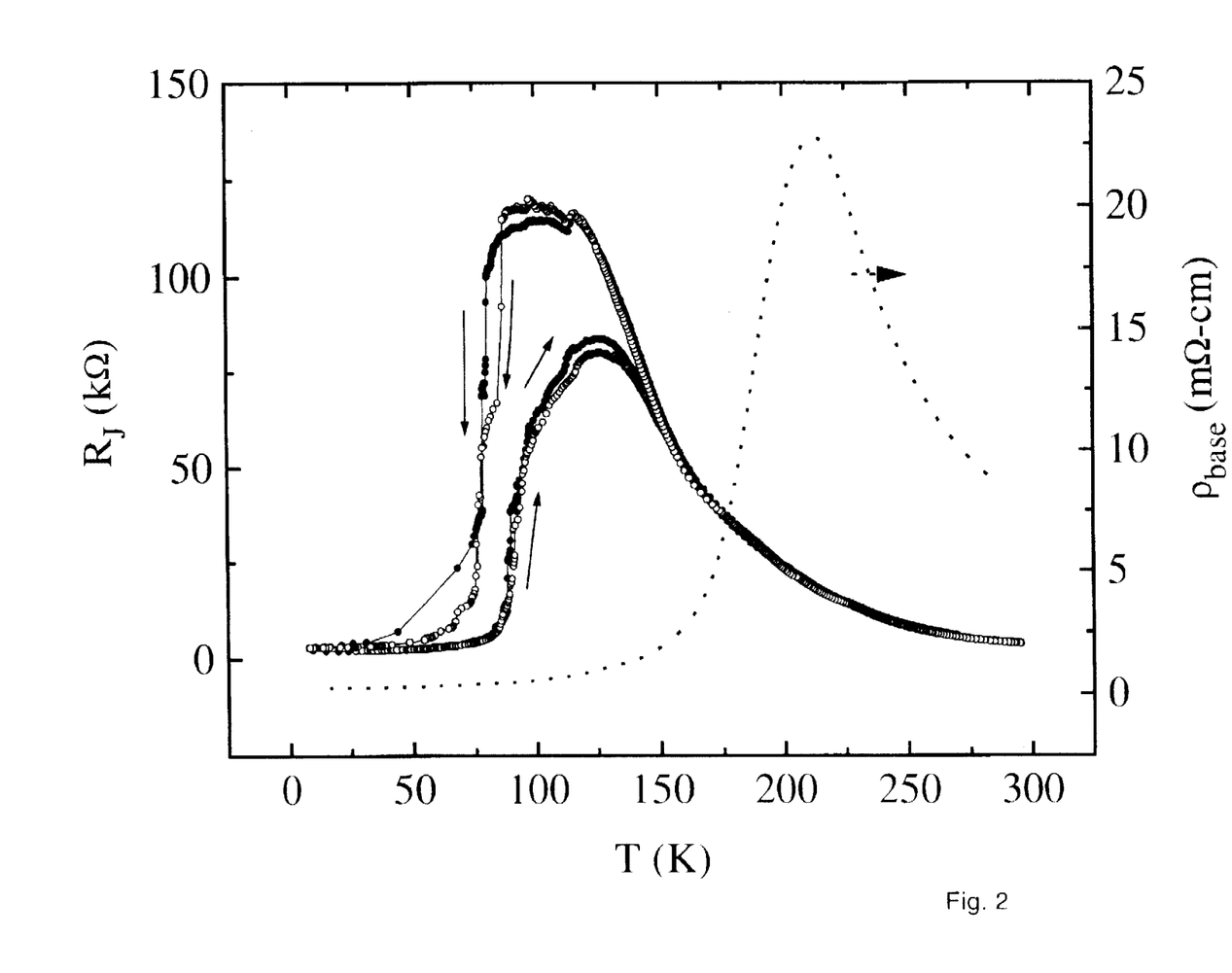
FIG. 2 is the measured temperature dependence of the resistance of the FIG. 1 device before and after it has been subjected to magnetic field exposure.

The temperature dependent resistance of the FIG. 1 device is shown in FIG. 2. The pillar 8 of this device was nearly octagonal in shape with an effective diameter around 7 μm. The temperature dependent base-electrode resistivity (dotted curve) is also shown for comparison. All data are taken in zero applied field. The two traces on the cooling cycle (denoted by downwardly pointing arrows) started at room temperature with no field exposure history. The two traces on the warming cycle (up arrows) are measured after the sample was subjected to a few hours of field cycling with an amplitude of 120 to 150 Oe, up to a sample temperature of about 200K. The cycling field was subsequently removed and the sample was cooled back down to 20K before these two warm-up traces were taken. The temperature dependence of the pillar resistance is significantly different from that of the base electrode, thus it is unlikely that the current spread in the base electrode contributed significantly to the measured pillar resistance. The pillar resistance appears to depend on the history of magnetic field exposure, suggesting a possible spin dependent modulation of resistance.

FIGS. 3(a) through 3(c) show the relative change of resistance at different temperatures as the sample was subject to a sweeping magnetic field of the order of 120 Oe. The measurement was performed by current biasing the pillar at 1 μA and then monitoring the voltage drop across the pillar as the field was swept and the sample temperature varied. Field dependent resistance modulations first become noticeable at temperatures slightly above 200K. For traces taken below 200K, some switching events can be observed occasionally, usually in a narrow temperature range of a few tens of degrees, riding on top of a rather smooth negative magnetoresistance slope that is roughly parabolic. When cooled below 170K, however, a different type of field-dependent response sets in. It is first manifested as a random telegraph noise. As the sample was cooled down to the temperature region between 101K and 89K, the response settled into a well defined switching event, driven by the applied magnetic field (FIG. 3(b)). At temperatures lower than 89K, this switching process froze into its lower resistance state. At even lower temperatures, a different switching event set in, as shown in FIG. 3(c) by the data taken at 57K.

Figure 3:
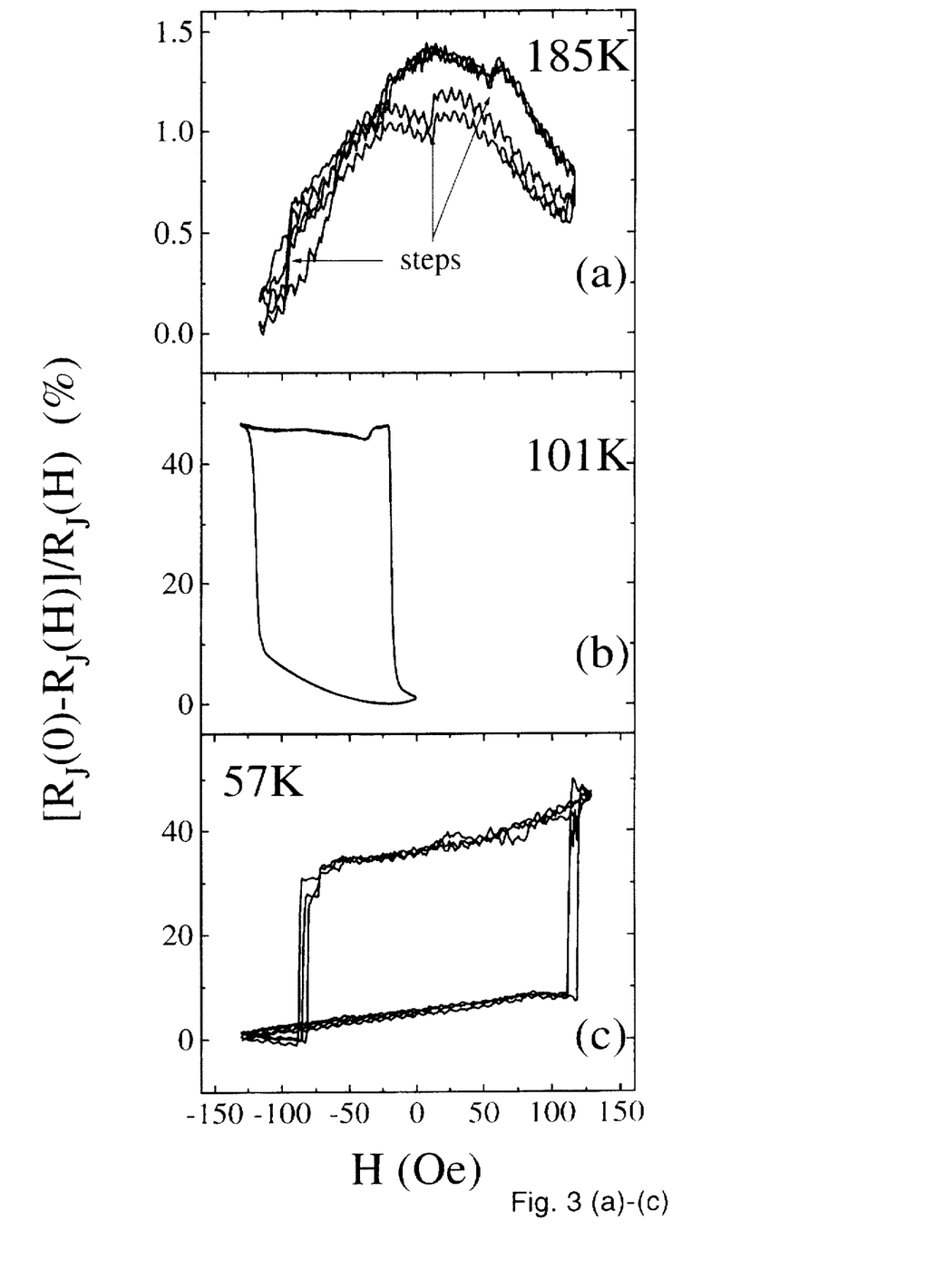
FIG. 3 shows the measured resistance of the device as a function of applied magnetic field at different temperatures.

These field-induced resistance changes are believed to be originated from the spin-dependent transport across the STO barrier layer. The transport conductance across the STO barrier is related to the relative angle of the local domains inside the two LCMO layers. Micromagnetics control the magnetic domain structure and relative orientation of magnetic moment for the two LCMO layers in the pillar. A change of the domain configuration in one electrode with respect to another will induce a change in the over-all resistance of the pillar. The field scale we observed for inducing the switching events are of the order of 102 Oe. This is consistent with the coercivity of LCMO films in separate measurements, suggesting involvement of domain rotation. The many different switching events in FIG. 3 suggest the pillar contains multiple magnetic states. It is likely therefore that multiple domains exist in the pillar. When plotted in absolute resistances, as shown in FIGS. 3($d$) and ($e$), a switching amplitude of almost a factor of two in resistance was seen. It is almost certain that the phenomena exhibited in FIG. 3 are only switching of portions of the pillar structure. A single domain pillar would certainly result in much larger resistance modulation amplitudes.

Figure 4:
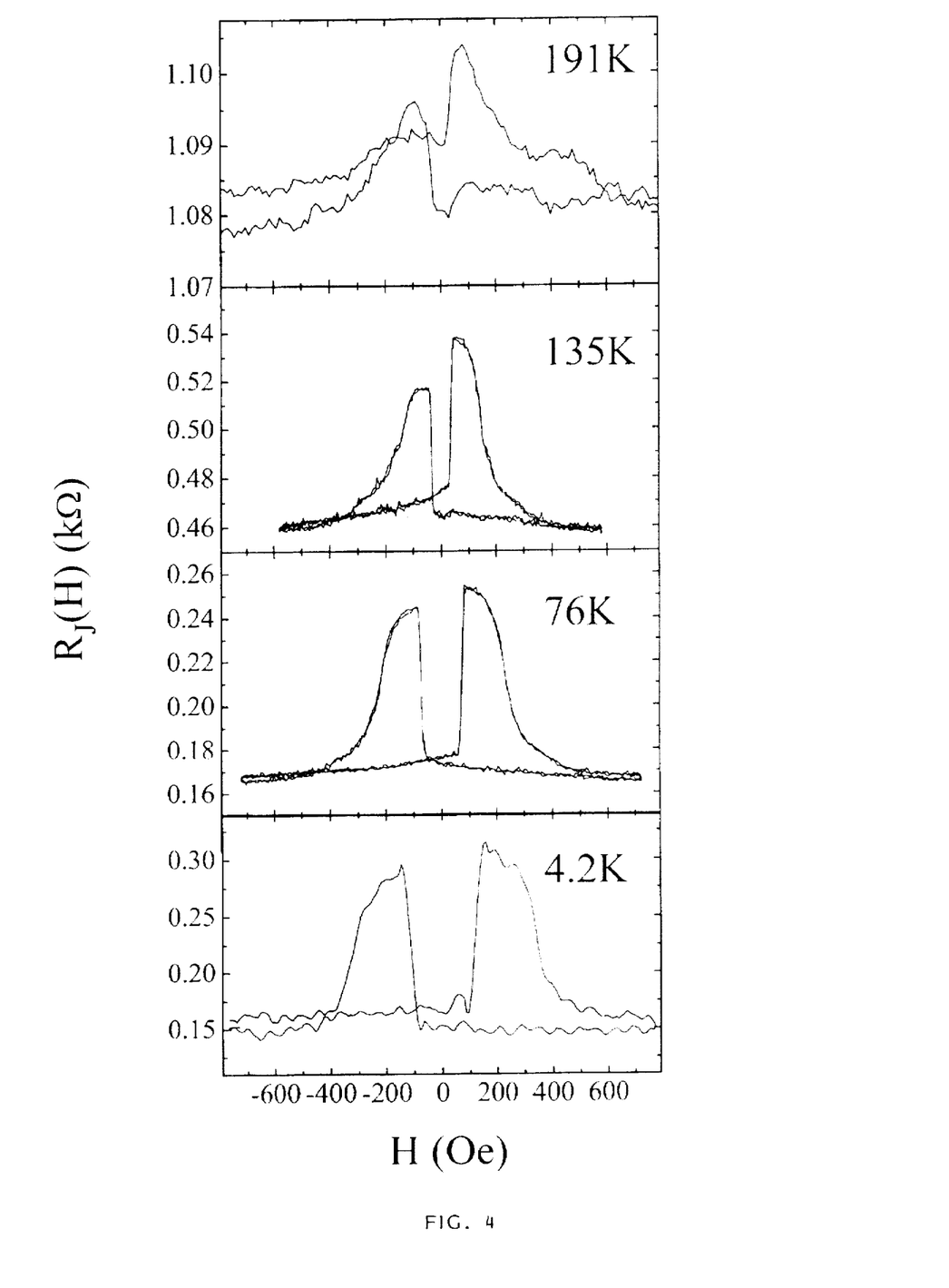
FIG. 4 shows the current-voltage (I–V) characteristic of the device at different temperatures.

Thin film tri-layers of LSMO/STO/LSMO were prepared by laser ablation using the same process as that used for making the LCMO/STO/LCMO tri-layers previously described. LSMO is $La_{0.67}Sr_{0.33}MnO_{3-d}$. The individual layer thicknesses were similar to those of the LCMO/STO/LCMO device previously described. The relative change of resistance as a function of magnetic field, at four different temperatures, for the LSMO/STO/LSMO pillar, 3 µm×5.5 µm in size, is shown in FIG. 4. Large magnetoresistance, up to a factor of two at 4.2K, has been observed at relatively modest fields. The shape of the resistance versus applied field curves (FIG. 4) is similar to that observed in metal-electrode based magnetic tunneling valves. These results demonstrate operation of the LSMO/STO/LSMO tunnel valve device at low temperatures.

Figure 5:
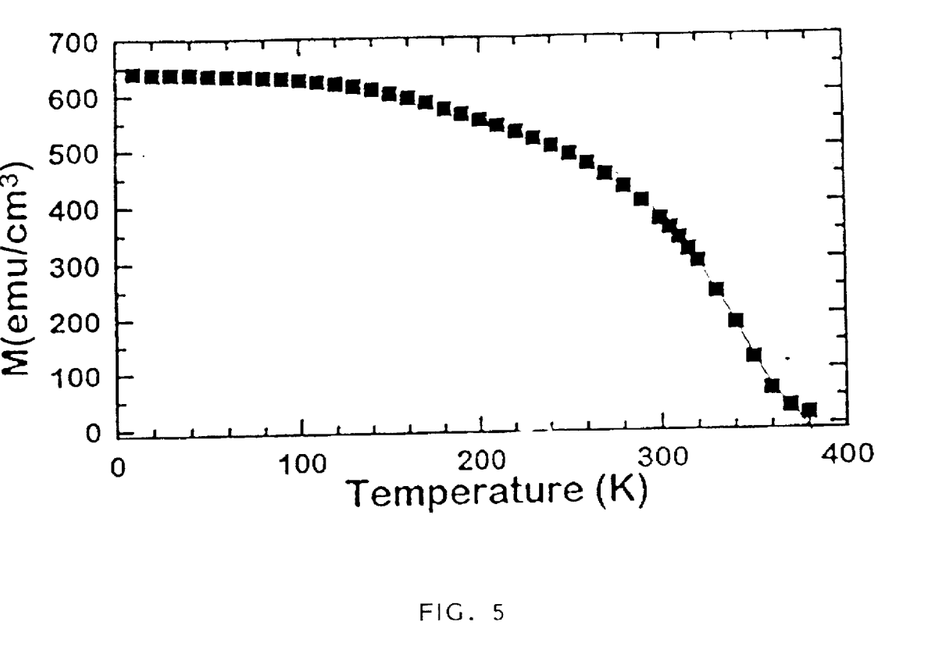
FIG. 5 shows the magnetization (M) as a function of temperature for a typical LSMO film.

FIG. 5 shows the magnetization versus temperature of a 100 nm thick LSMO film grown by laser ablation. The film is ferromagnetic at room temperature with a magnetization of about 60% of that at 4.2K making room temperature operation feasible using this material. The high temperature operation coupled with the low coercivity of the LSMO material would make devices using these materials attractive as low field sensors.

Figure 6A:
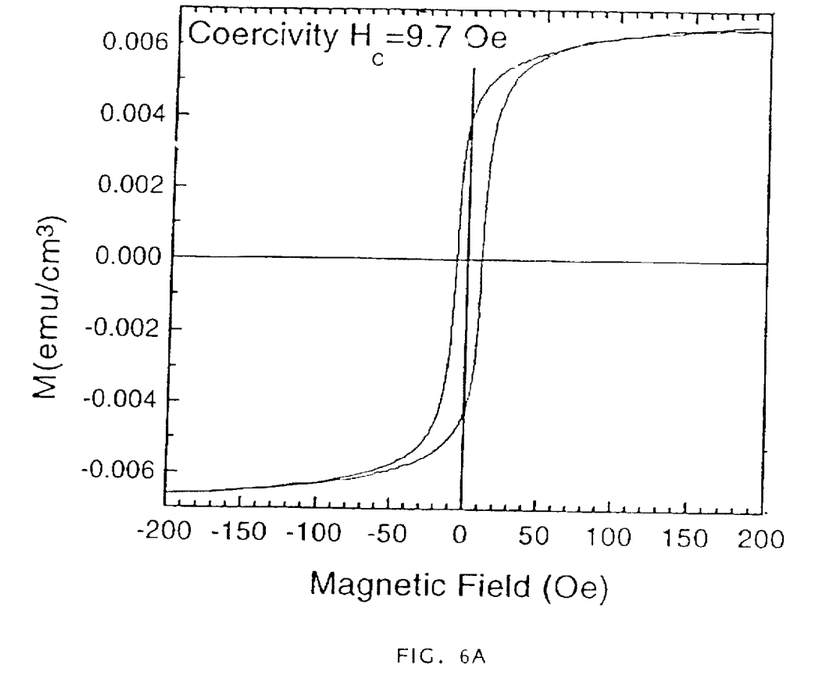
FIG. 6A shows the hysteresis loop of a typical LSMO thin film at room temperature.
Figure 6B:
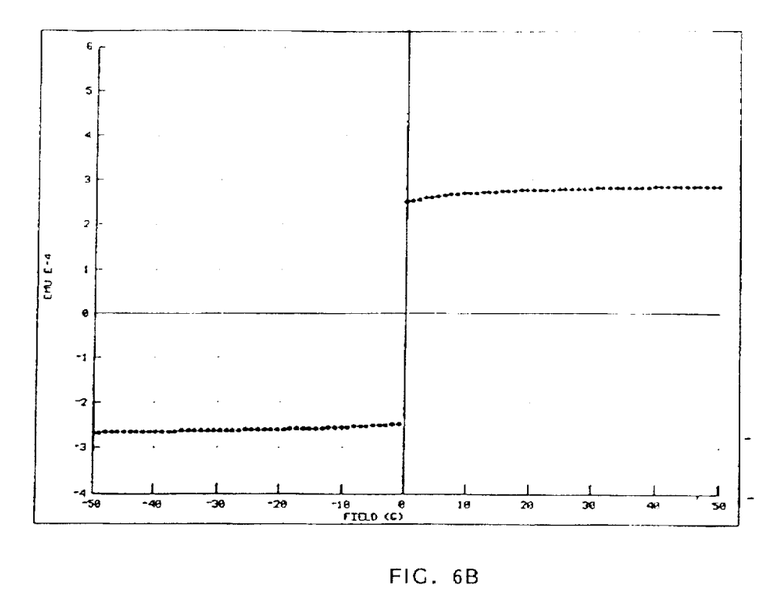
FIG. 6B shows the room temperature hysteresis loop of a typical LSMO thin film grown under conditions of interrupted growth.

The coercivity of epitaxial films of LSMO grown on $SrTiO_3$ substrates has been observed to be very low (about 10 Oe) at room temperature. The (110) direction has been found to be the easy axis direction in these films. The hysteresis loop of a typical LSMO film measured using a Vibrating Sample Magnetometer is shown in FIG. 6$a$. Films grown under conditions of interrupted growth (deposit about 10% of thickness, pause approximately 60 seconds, repeat) have shown even lower values for the coercivity (<1 Oe) as shown in FIG. 6$b$.

The magnetic domain properties of the top and bottom ferromagnetic elements are very important in controlling the magnitude and observed field dependence of the magnetoresistance. Kerr microscopy has been performed at room temperature to study the magnetic domain properties of the LSMO films grown on single crystal and polycrystalline $SrTiO_3$ substrates. It was found that domain boundaries in these films can be easily pinned along artificially created structural defects such as stress-induced microcracks or grain boundaries.

Figure 7A:
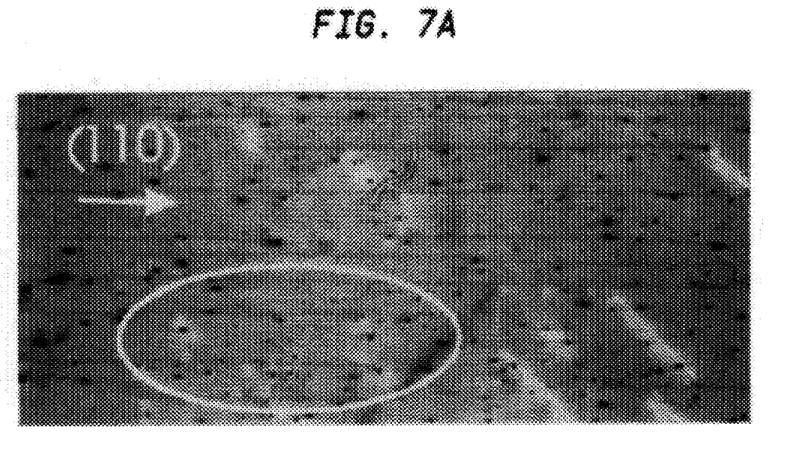
FIG. 7 shows optical and Kerr images and their interpretation of a thick LSMO sample.
Figure 7B:
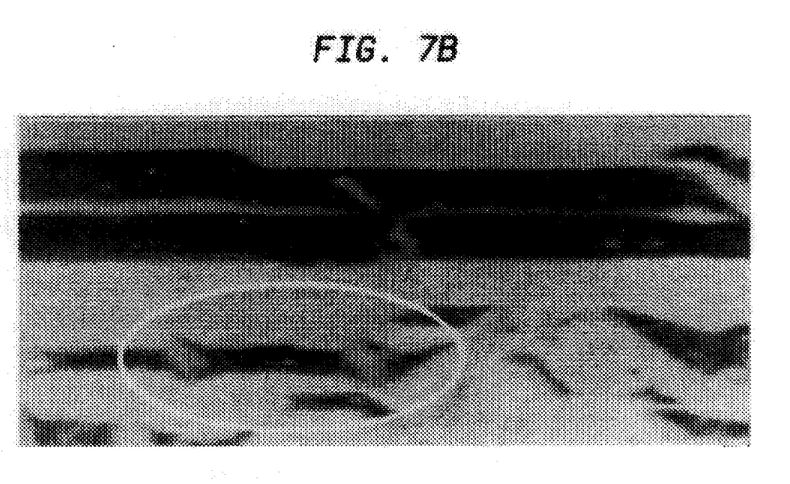
Figure 7C:
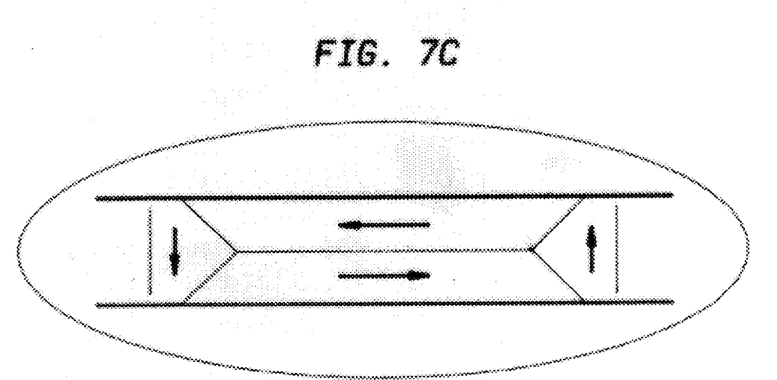
Figure 8A:
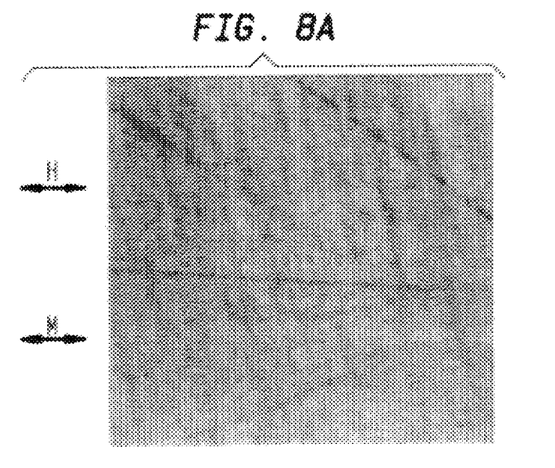
FIG. 8 shows Kerr images and their interpretation for a thin film LSMO sample in a remanant state.
Figure 8C:
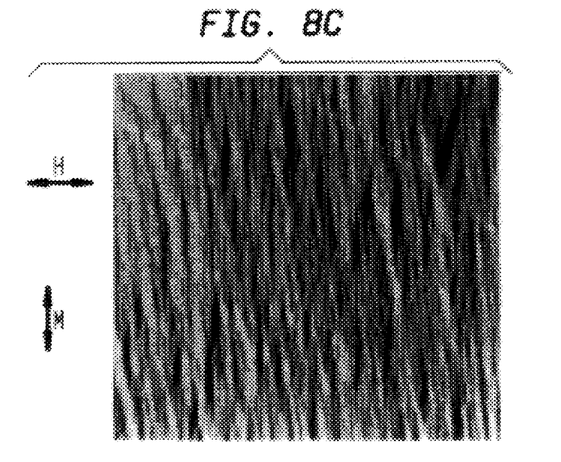
Figure 8D:
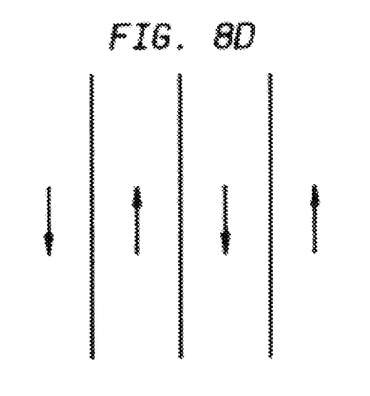
Figure 8E:
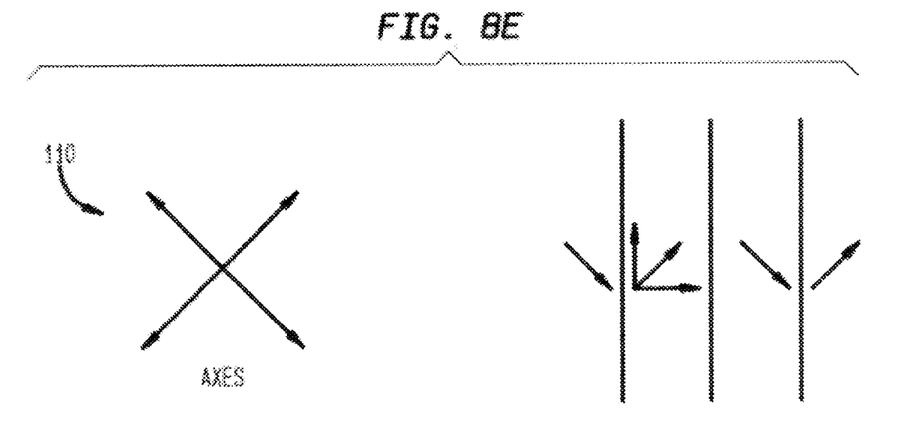

A thick single crystal film (360 nm) of LSMO was observed to contain cracks due to the thermal expansion mismatch with the substrate. Kerr microscopy shows that the domains are limited by the cracks. FIG. 7 shows part of a thick (360 nm) LSMO sample in which cracks mostly run from left to right and define long rectangular areas. FIG. 7($a$) is an optical image of the sample as seen through a polarizing Kerr microscope. FIG. 7($b$) shows the Kerr response to small fields of plus and minus 6 Oe. Straight walls are found to move in the center of the rectangular areas (wall coercivity of about 4 Oe). Some of the rectangular areas have completely reversed. The magnetization in the circled areas of FIGS. 7($a$) and 7($b$) is schematically described in FIG. 7($c$). The arrows indicate magnetization directions.

In contrast, the domains of uncracked films (<100 nm) are small and defined by the dispersion of the two (110) easy axes (FIG. 8). FIG. 8 displays Kerr images and their interpretation for a thin (50 nm) LSMO sample in a remanent state. H indicates the axis along which the magnetic field is applied. M indicates which component of magnetization is being measured. The contrast in FIG. 8($a$) is uniform so that the horizontal component of magnetization is uniform as shown in FIG. 8($b$). The contrast in FIG. 8($c$) changes rapidly from black to white indicating an alternating vertical component of the magnetization as shown in FIG. 8($d$). FIG. 8($e$) puts these two results together and shows the magnetization alternating between two (110) axes.

Figure 9A:
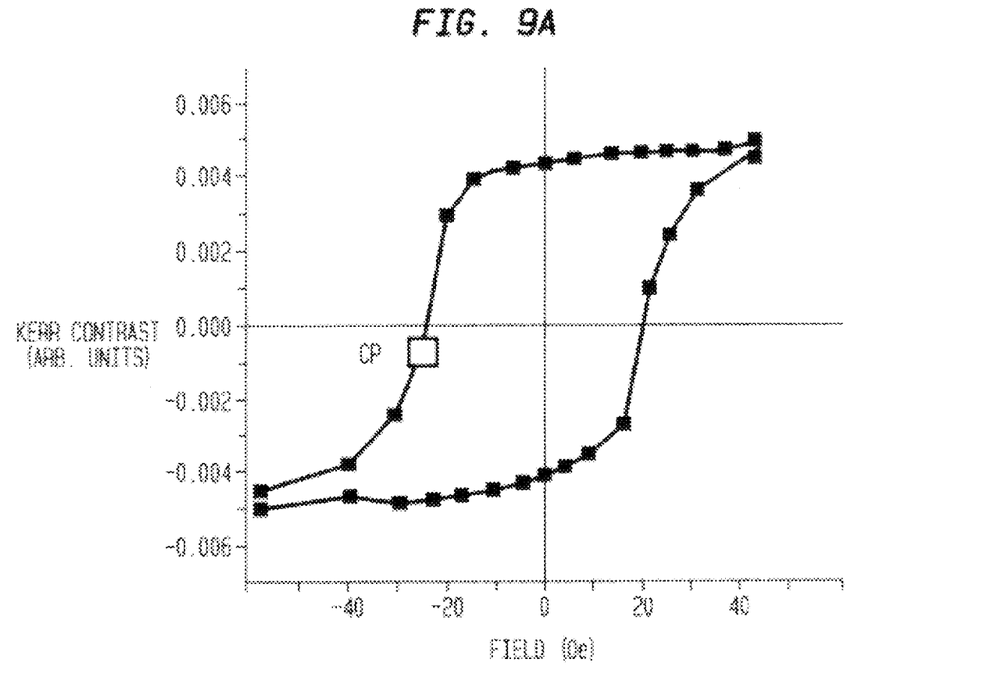
FIG. 9 is a Kerr MH loop and Kerr image of a polycrystalline LSMO sample.
Figure 9B:
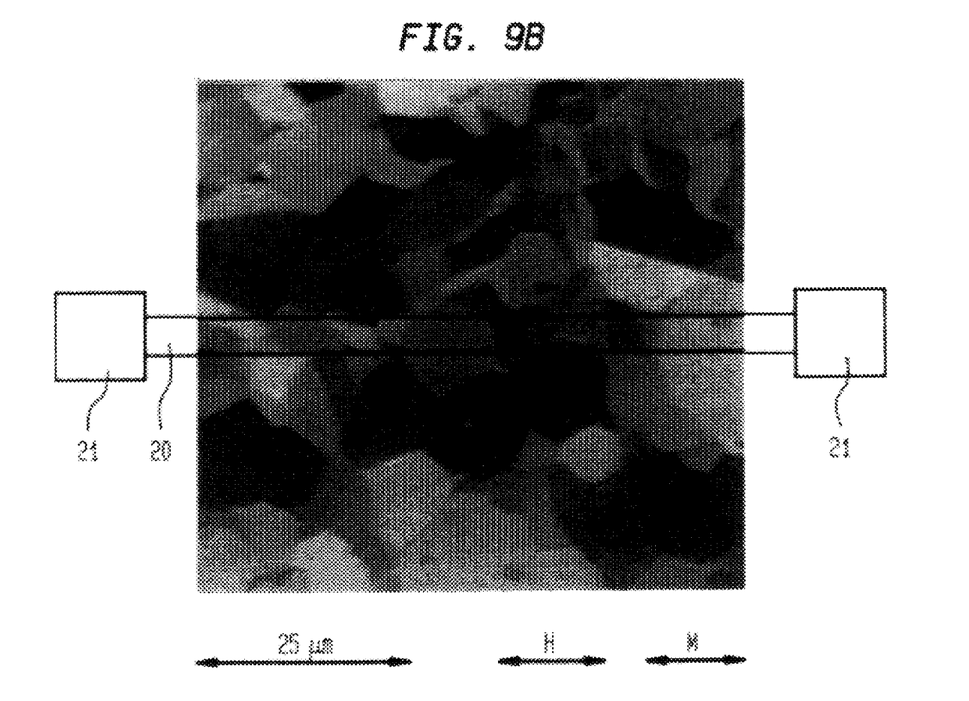

In the case of polycrystalline films the coercivity varies with grain orientation, with the average value being about 25 Oe. In these films the grain boundaries can couple the domains between grains. It is also possible to have multiple domains within one grain. FIG. 9($a$) is a Kerr MH loop of a polycrystalline LSMO sample. The loop is averaged over many grains. FIG. 9($b$) is a Kerr image of the sample close to the coercive point (indicated by "cp" in FIG. 9($a$). On average, half of the grains have switched. AS in FIG. 8, H indicates the axis along which the magnetic field applied and M indicates which component of magnetization is being measured. Element 20 defines a line of magnetic material. Current is applied from to the line from electrodes 21.

Based on the microscopy studies, two additional device structures where the conducting channel consists of magnetic interfaces or domain boundaries are possible. In these structures the conduction electrons are almost completely polarized within a uniform magnetic layer or inside a magnetic domain due to the strong intratomic Hund's exchange. As electron waves travel near the layer interfaces or domain boundaries, the resistivity of the conduction channels will be enhanced due to strong backward reflections. Because of the low coercivity of the manganate, application of a moderately low field (tens of Oe) can readily switch the magnetic moment of each layer or domains into a parallel configuration, similar to the tunnel valve structure. This will result in a large decrease in the resistance for electron wave propagation at small fields. Because the operation temperature is tens of degrees below the ferromagnetic transition temperature, the thermal stability should also be improved.

The first type of structure is a vertical superlattice comprised of magnetic and metallic layers, with electrical current flowing perpendicular to the layers. As in the tunneling junctions, the manganate layers will have slightly different coercivities. The metallic layers can be $SrRuO_3$ or other perovskites which are lattice matched and can be grown epitaxially on the multilayers. When the applied field is above the coercivity of both manganate layers, the magnetization of both layers are parallel to each other. Electrons are free to move across the interface, leading to a low resistance. When the field is reduced to a value in between the coercivity of the two layers, the manganate layer with the lower coercivity will switch. The resulting antiparallel magnetic configuration will cause strong interfacial spin-dependent scattering, leading to a high resistance. Such structures would be useful in low field sensors.

The second type of structure is a quasi one-dimensional (1D) wire (width 0.1–1 µm) to be fabricated by e-beam and optical lithography. Along the conduction path the substrate will have a high concentration of structural defects which can be created artificially or by using polycrystalline $SrTiO_3$ substrates. As discussed earlier, manganate films deposited on such a substrate are expected to develop numerous pinned magnetic domain boundaries. The quasi 1D confinement forces the conduction electrons to traverse many defect boundaries. The resulting strong spin-dependent scattering at the boundaries will lead to a high zero-field resistivity. Because of the low coercivity, a weak applied field will help align the magnetization of each domain along the 1D wire and cause the resistivity to drop substantially. At room temperature the MR should only be weakly dependent on temperature for a material like LSMO (Tc=380K). Such structures should also be useful in low field sensors.

The device of FIG. 1 is useful, for example, as a field sensor. More particularly, the field sensor could be used as a magnetic recording read head. Such heads are described, for example, by D. Markham and F. Jeffers in "Magnetoresistive head technology" in Proceedings of the Electrochemical Society, Vol. 90-8, pp. 185–204, which is incorporated herein by reference. Further, the device of FIG. 1 could also be used as a data storage element in a magnetic random access memory device.

While described in terms of tri-layers, such tri-layers form the basic device and the basic building block. Above the basic building block lie multi-layer structures such as a structure comprising layers 2-3-4-3-2. While certain structures are described as pillars, thus implying a circular cross-section, such structures are not so limited. Such structures may be of any cross-sectional shape as is dictated by the device and are capable of being produced.

While the invention has been described with respect to preferred embodiments thereof, it will be appreciated by those of skill in the art that variations may be made without departing from the spirit and scope of the invention.

Having thus described our invention, what we claim as new and desire to secure by Letters Patent is:

1. A tri-layer thin film magnetoresistive device comprising:

a first or bottom thin film magnetic layer;

a second or intermediate layer;

a third or top thin film magnetic layer;

wherein said second or intermediate layer is one selected from the group comprising a metal and an insulator which disrupts the magnetic exchange coupling between said first and third layers while allowing the passage of electrical current thereacross and wherein at least one of said first or third layers is a doped manganese perovskite and wherein if only one of said first and third layers is a doped perovskite then the other is a ferromagnetic element or compound which exhibits spin polarization.

2. The device of claim 1 wherein said second layer is an insulating tunneling barrier.

3. The device of claim 1 wherein said second layer is the perovskite oxide $SrTiO_3$.

4. The device of claim 1 wherein said first and third layers are LCMO and said second layer is STO.

5. The device of claim 1 wherein said first and third layers are LSMO and said second layer is STO.

6. The device of claim 1 wherein said first magnetic layer is situate on a substrate.

7. The device of claim 6 wherein said substrate is silicon.

8. The device of claim 6 wherein said substrate is $SrTiO_3$.

9. A tri-layer thin film magnetoresistive device comprising:

a first contact electrode;

a first or bottom thin film magnetic layer;

a second or intermediate layer;

a third or top thin film magnetic layer; and a second contact electrode;

wherein said second or intermediate layer is one selected from the group comprising a metal and an insulator which disrupts the magnetic exchange coupling between said first and third layers while allowing the passage of electrical current thereacross and wherein at least one of said first or third layers is a doped manganese perovskite and wherein if only one of said first and third layers is a doped perovskite then the other is a ferromagnetic element or compound which exhibits spin polarization.

10. The device of claim 9 wherein said second layer is an insulating tunneling barrier.

11. The device of claim 9 wherein said second layer is the perovskite oxide $SrTiO_3$.

12. The device of claim 9 wherein said first and third layers are LCMO and said second layer is STO.

13. The device of claim 9 wherein said first and third layers are LSMO and said second layer is STO.

14. The device of claim 9 further including a protective layer inbetween said third magnetic layer and said second contact electrode.

15. The device of claim 9 wherein said first magnetic layer is situate on a substrate.

16. The device of claim 9 wherein said substrate is silicon.

17. The device of claim 9 wherein said substrate is $SrTiO_3$.

* * * * *